(12) United States Patent
Kovats

(10) Patent No.: US 8,822,270 B2
(45) Date of Patent: Sep. 2, 2014

(54) CONFIGURABLE PASSIVE COMPONENTS

(75) Inventor: Julius Andrew Kovats, Manitou Springs, CO (US)

(73) Assignee: Atmel Corporation, San Jose, CA (US)

( * ) Notice: Subject to any disclaimer, the term of this patent is extended or adjusted under 35 U.S.C. 154(b) by 89 days.

(21) Appl. No.: 13/553,496

(22) Filed: Jul. 19, 2012

(65) Prior Publication Data

US 2014/0021582 A1    Jan. 23, 2014

(51) Int. Cl.
*H01L 21/00*    (2006.01)

(52) U.S. Cl.
USPC ........... 438/109; 438/113; 438/238; 438/381; 438/462; 438/463; 438/455; 438/957

(58) Field of Classification Search
CPC ........... H01L 2224/48227; H01L 2224/73265; H01L 2924/00; H01L 2224/32225; H01L 2224/97; H01L 2924/15311; H01L 2224/48091; H01L 2224/48247; H01L 2924/00014; H01L 2924/01079; H01L 2924/19041; H01L 2224/45144; H01L 2924/01078

USPC ......... 438/109, 113, 238, 381, 462, 463, 455, 438/957

See application file for complete search history.

(56) References Cited

U.S. PATENT DOCUMENTS 6,356,453 B1 *    3/2002    Juskey et al. ................. 361/760

OTHER PUBLICATIONS

EMSC—Embedded & Wirebond Silicon Capacitor, IPDIA, Doc CL431111615143, Mar. 1, 2012.
Wire Bondable Passive Components Product Family, Vishay Intertechnology, Inc., Mar. 1, 2012.

* cited by examiner

*Primary Examiner* — Michelle Mandala
(74) *Attorney, Agent, or Firm* — Fish & Richardson P.C.

(57) ABSTRACT

A wafer of passive components is diced to leave a flat passive chip. The flat passive chip has bond pads for passive components on a same side of the flat passive chip. The flat passive chip is stacked onto an active chip. The passive components are wirebonded together to connect the passive components in series or parallel, resulting in the flat passive chip having an overall passive characteristic equal to a target characteristic.

7 Claims, 3 Drawing Sheets ial to configurable passive components.

BACKGROUND

Electronic fabrication facilities can produce wafers of passive components which can then be diced into individual passive component chips. A passive component chip can be stacked onto an active chip. Producing wafers of passive components can take a long time due to the time involved in staging production equipment and sending materials through the fabrication process.

SUMMARY

A wafer of passive components is diced to leave a flat passive chip. The flat passive chip has bond pads for passive components on the same side of the flat passive chip. The flat passive chip is stacked onto an active chip. The passive components are wirebonded together to connect the passive components in series or parallel, resulting in the flat passive chip having an overall passive characteristic equal to a target characteristic.

Particular implementations can provide one or more of the following advantages: 1) the method allows rapid prototyping and volume production of passive components in a stacked die configuration; 2) a wafer can be stored with an array of passive components readily available and samples or production be quickly deployed without the lead time for a custom passive component; 3) particular characteristics of a passive chip can be targeted using dicing and wirebonding; and 4) laser dicing or pre-dicing can mitigate shorting or smearing during mechanical dicing.

The details of one or more disclosed implementations are set forth in the accompanying drawings and the description below. Other features, aspects, and advantages will become apparent from the description, the drawings and the claims.

DETAILED DESCRIPTION

Example Wafer of Passive Components

Figure 1:
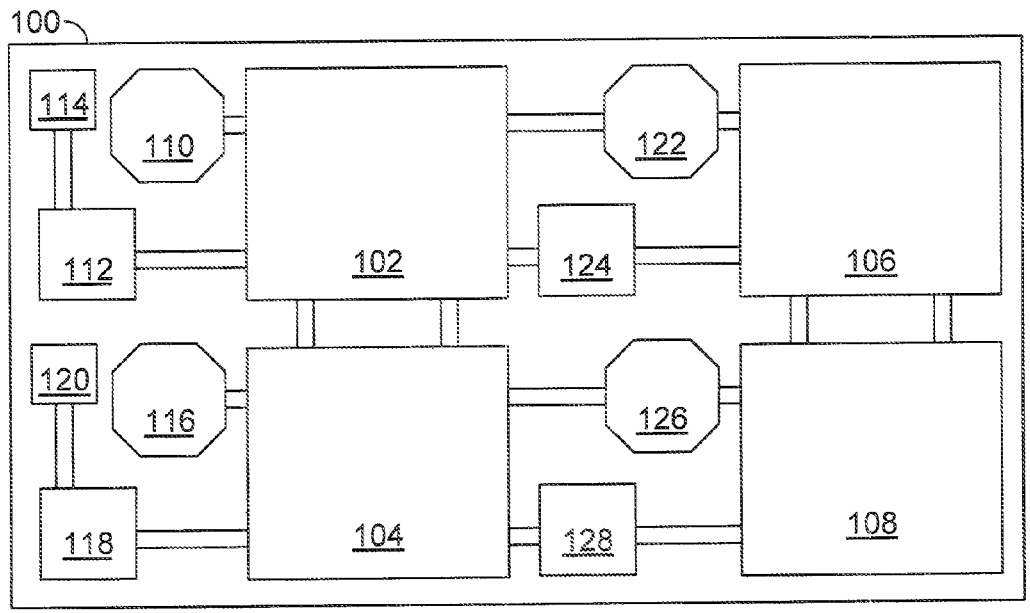
FIG. 1 is a schematic top view of an example wafer of passive components.

FIG. 1 is a schematic top view of an example wafer 100 of passive components. The passive components can be, for example, capacitors, resistors, or inductors, and combinations of different types of passive components. The passive components can be characterized by certain characteristics. For example, capacitors have a capacitance, resistors have a resistance, and inductors have an inductance. For purposes of illustration, the wafer will be described as including four capacitors 102, 104, 106, and 108. The wafer can be diced, wirebonded, or both to create a passive chip having a target capacitance.

Each of the capacitors has two plates accessible on a same side of the wafer, e.g., the top side of the wafer. Capacitor 102 has one plate accessible by a first bond pad 110 and another plate accessible by a second bond pad 112 and an optional third bond pad 114 connected to the second bond pad by a trace. Similarly, capacitor 104 has one plate accessible by a first bond pad 116 and another plate accessible by a second bond pad 118 and an optional third bond pad 120. Capacitor 106 has one plate accessible by a first bond pad 122 and another plate accessible by a second bond pad 124. Capacitor 108 has one plate accessible by a first bond pad 126 and another plate accessible by a second bond pad 128.

The bond pads can have various shapes. For purposes of illustration, bond pads going to one plate of a capacitor are illustrated as being octagonal and bond pads going to the other plate of the capacitor are illustrated as being square. The bond pads can be elongated and arranged to allow at least two wirebonds to connect to each pad.

Bond pads 110 and 122 are connected by a trace. Similarly, bond pads 116 and 126 are connected by a trace, bond pads 112 and 124 are connected by a trace, and bond pads 118 and 128 are connected by a trace. Capacitors 102 and 104 are connected by two traces, one for each pair of matching plates. Similarly, capacitors 106 and 108 are connected by two traces, one for each pair of matching plates.

The capacitors are generally flat, and the wafer overall is generally flat, making any passive chips created from the wafer suitable for stacking on top of or below an active chip. Stacking on an active chip is useful because X-Y surface area is valuable in various applications. Having bond pads on the same side of the wafer is useful because the passive chips can be stacked without requiring conductive epoxy, or other electrical connections, on the other side of the wafer.

The wafer can be produced and stored before the application of the passive chips is known or a target characteristic of the passive chips is known. When the target characteristic is known, the wafer can be diced, wirebonded, or both to create passive chips having the target characteristic. This is useful, for example, in rapid prototyping, but the wafer can also be used to create passive chips in a volume production environment.

Figure 2A:
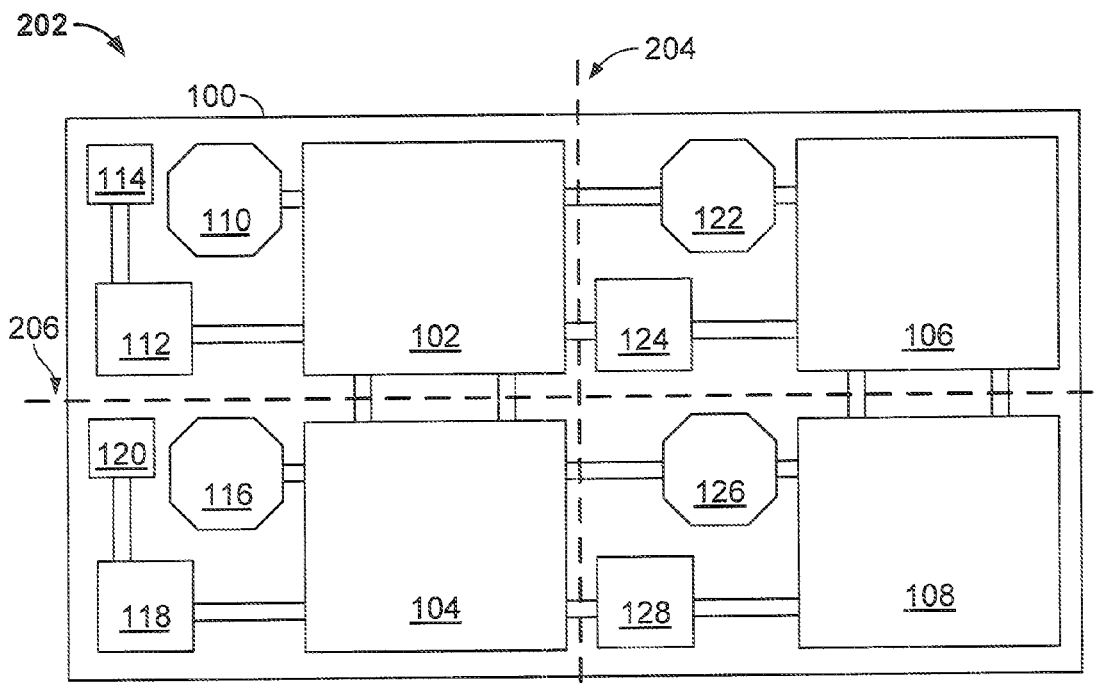
FIGS. 2A-2C illustrate different example ways to dice and wirebond the example wafer of FIG. 1.
Figure 2B:
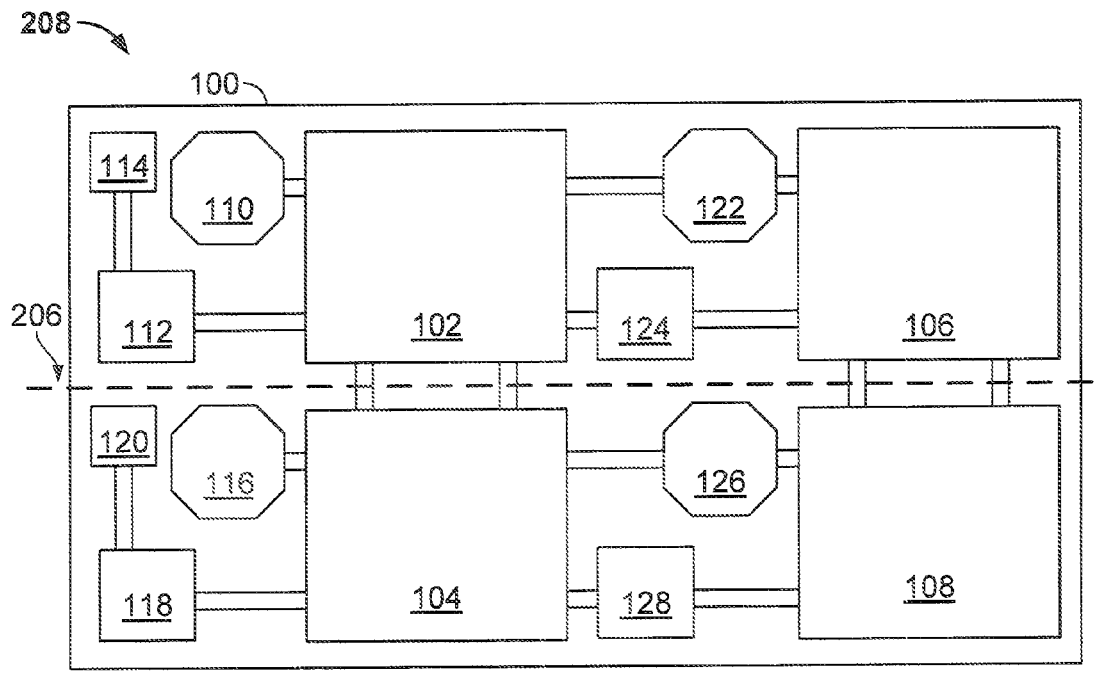
Figure 2C:
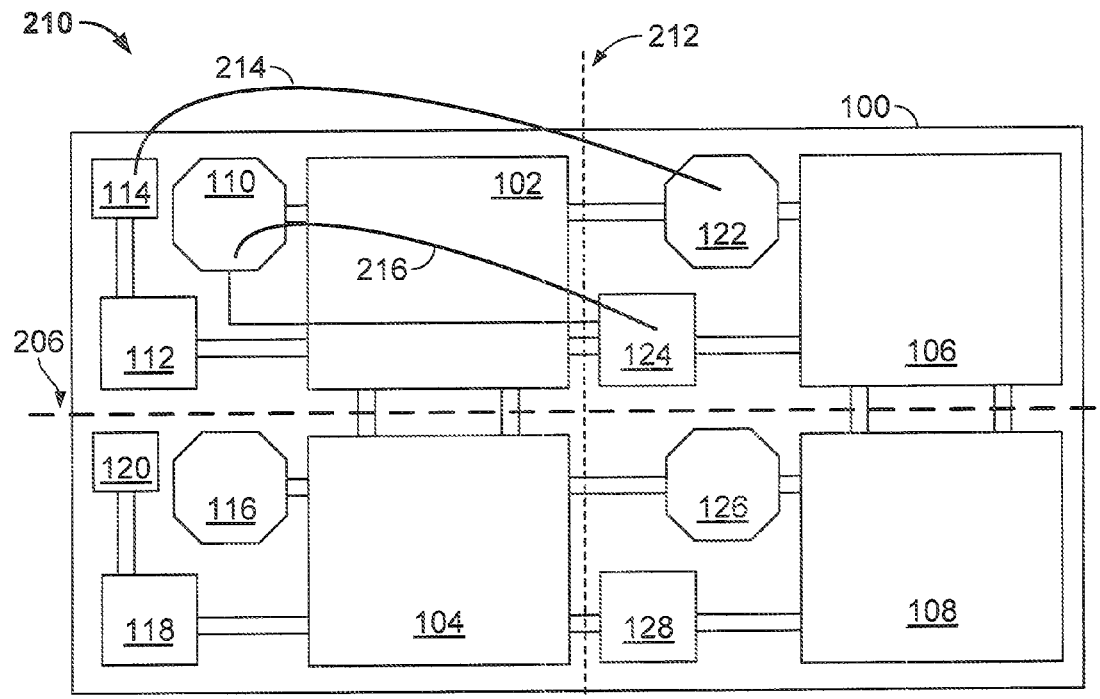

FIGS. 2A-2C illustrate different example ways to dice and wirebond the example wafer 100 of FIG. 1. For purposes of illustration, in referring to these figures, suppose that capacitors 102 and 104 are 3 nF capacitors and that capacitors 106 and 108 are 5 nF capacitors. The capacitors can electrically connected in various ways, e.g., various combinations of serial and parallel connections, to create various values of overall capacitance for a passive chip diced from the wafer.

FIG. 2A is a schematic diagram illustrating one example way to dice and wirebond the example wafer to create a passive chip 202 having a target capacitance. The wafer is diced along a vertical scribe line 204 and a horizontal scribe line 206, leaving the passive chip. The passive chip includes a single 3 nF capacitor, so the overall capacitance of the passive chip is 3 nF.

FIG. 2B is a schematic diagram illustrating one example way to dice and wirebond the example wafer to create a passive chip 208 having a target capacitance. The wafer is diced along a horizontal scribe line 206, leaving the passive chip. The passive chip includes one 3 nF capacitor and one 5 nF capacitor in parallel, so the overall capacitance of the passive chip is 8 nF.

FIG. 2C is a schematic diagram illustrating one example way to dice and wirebond the example wafer to create a passive chip 210 having a target capacitance. The wafer is diced along a horizontal scribe line 206 and laser diced along a vertical scribe line 212, leaving the passive chip. The laser dicing only removes the top-most layer of the wafer, leaving the substrate intact. A first wirebond 214 connects bond pad 114 and bond pad 122. A second wirebond 216 connects bond pad 110 and bond pad 124, resulting in capacitor 102 and capacitor 106 being connected in series. So the overall capacitance of the passive chip is $1/3+1/5=8/15$ nF.

FIGS. 2A-2C are examples of possible combinations. The wafer can be diced and wirebonded so that capacitors 102 and 104 are connected in series ($2/3$ nF) or parallel (6 nF). The wafer can be diced and wirebonded so that capacitors 106 and 108 are connected in series ($2/5$ nF) or parallel (10 nF). The wafer can be diced and bonded so that any two, three, or four of the capacitors are connected in series or parallel.

Example Production Flowchart

Figure 3:
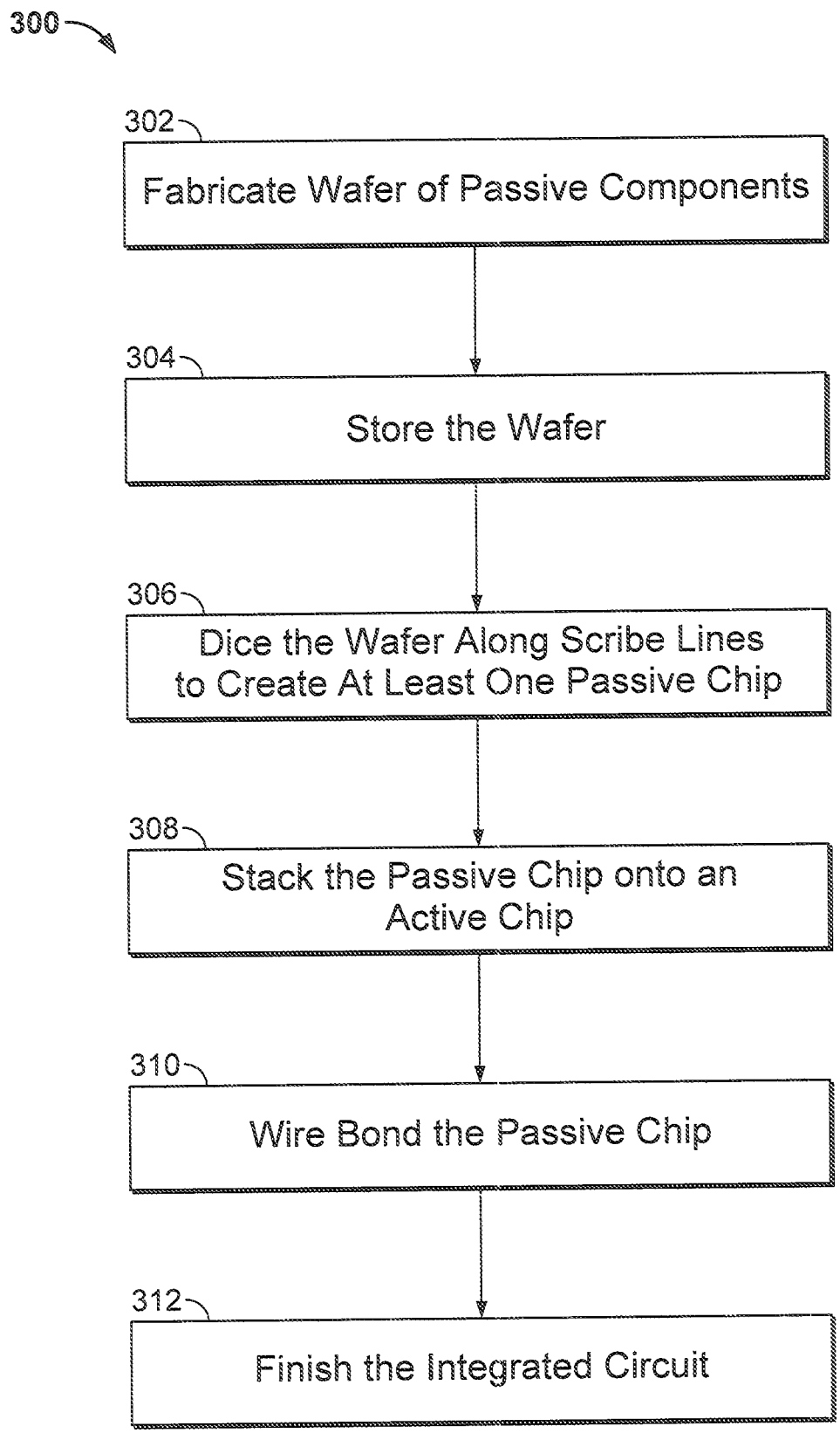
FIG. 3 is a flow diagram of an example process for producing an integrated circuit.

FIG. 3 is a flow diagram of an example process 300 for producing an integrated circuit.

A wafer of passive components is fabricated (302). The kinds of passive components and their sizes are selected to provide a range of possible configurations for one or more applications. For example, if passive chips with capacitances in the range of 5-20 nF are desirable, the wafer can be fabricated with 3 nF and 5 nF capacitors as described above with reference to FIG. 1 and FIGS. 2A-C. The kinds of passive components and their sizes can be selected to have an X-Y size compatible with an active chip for stacking.

The wafer can be fabricated using Metal-Insulator-Metal (MIM) techniques or other appropriate techniques. In general, the passive components are flat and suitable for stacking in the Z direction. The passive components have two or more electrodes accessible by bond pads on a same side of the wafer.

The wafer is stored (304). The wafer can be stored momentarily or for an extended period of time. When the application for the passive components is known, and an active chip is known, the scribe lines for dicing and bond diagram for wirebonding can be produced. The passive chips can be relatively quickly deployed without the lead time for custom passive components.

The wafer is diced (306). The wafer is diced along scribe lines to create at least one passive chip. In some implementations, wafer is diced by laser dicing first, and then by mechanical dicing. The laser pre-dicing can prevent shorting or smearing that can result from the mechanical dicing process in some cases.

The passive chip is stacked onto an active chip, forming the integrated circuit (308). The passive chip can be attached by a die attach process. Non-conductive die attach epoxy can be used. The passive chip can be stacked on top of the active chip or below the active chip.

The passive chip is wirebonded to give the overall passive chip a characteristic equal to a target characteristic (310). For example, the passive chip can be wirebonded as described above with reference to FIG. 2C. The passive chip can be wirebonded to place one or more passive components in serial or parallel connection or in combinations of serial and parallel connections to achieve the target characteristic.

The integrated circuit is optionally encapsulated, tested, and marked (312). Other conventional finishing processes can be applied to the integrated circuit. The integrated circuit can be mounted on a printed circuit board or used in another application.

While this document contains many specific implementation details, these should not be construed as limitations on the scope what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can, in some cases, be excised from the combination, and the claimed combination may be directed to a sub combination or variation of a sub combination.

What is claimed is:

1. A method for producing an integrated circuit, the method comprising:
    identifying a target passive electrical characteristic;
    after identifying the target passive electrical characteristic, dicing a wafer comprising a plurality of passive components to leave a flat passive chip, the flat passive chip comprising at least first and second passive components of the plurality of passive components, each of the first and second passive components comprising at least first and second electrodes accessible by first and second bond pads on a same side of the flat passive chip;
    stacking the flat passive chip onto an active chip; and
    wirebonding between a first bond pad of the first passive component and a second bond pad of the second passive component so that an overall passive electrical characteristic of the flat passive chip is equal to the target passive electrical characteristic.

2. The method of claim 1, wherein the first and second passive components are capacitors having different capacitances, and wherein the overall passive electrical characteristic is a combination of the different capacitances.

3. The method of claim 1, wherein the dicing and wirebonding results in the first and second passive components being connected in series or parallel.

4. The method of claim 1, wherein stacking the flat passive chip onto the active chip comprises attaching the flat passive chip to the active chip with non-conductive epoxy.

5. The method of claim 1, wherein the plurality of passive components are Metal-Insulator-Metal (MIM) components.

6. The method of claim 1, wherein dicing the wafer comprises laser dicing the wafer along at least one scribe line.

7. The method of claim 6, further comprising mechanically dicing the wafer along the at least one scribe line after the laser dicing.

* * * * *